US011387103B1

United States Patent
Warrender et al.

(10) Patent No.: US 11,387,103 B1
(45) Date of Patent: Jul. 12, 2022

(54) PROCESS FOR FABRICATING SEMICONDUCTOR NANOFIBERS

(71) Applicant: U.S. Government as Represented by the Secretary of the Army, Dover, NJ (US)

(72) Inventors: Jeffrey Warrender, Averill Park, NY (US); Quentin Hudspeth, Clifton Park, NY (US)

(73) Assignee: The United States of America as Represented by the Secretary of the Army, Washington, DC (US)

(*) Notice: Subject to any disclaimer, the term of this patent is extended or adjusted under 35 U.S.C. 154(b) by 267 days.

(21) Appl. No.: 16/863,489

(22) Filed: Apr. 30, 2020

Related U.S. Application Data

(60) Provisional application No. 62/841,283, filed on May 1, 2019.

(51) Int. Cl.
| | | |
|---|---|---|
| *H01L 21/205* | (2006.01) | |
| *H01L 21/02* | (2006.01) | |
| *D01F 9/08* | (2006.01) | |
| *C23C 14/06* | (2006.01) | |
| *C23C 14/28* | (2006.01) | |

(52) U.S. Cl.
CPC ........ *H01L 21/02653* (2013.01); *C23C 14/06* (2013.01); *C23C 14/28* (2013.01); *D01F 9/08* (2013.01); *H01L 21/02381* (2013.01); *H01L 21/02603* (2013.01); *D10B 2101/20* (2013.01)

(58) Field of Classification Search
CPC ......... H01L 21/02603; H01L 21/02645; H01L 31/035227; H01L 21/02606; H01L 29/0669
See application file for complete search history.

(56) References Cited

U.S. PATENT DOCUMENTS

| | | | | |
|---|---|---|---|---|
| 2005/0031525 A1* | 2/2005 | Iijima | ................... | B82Y 30/00 423/445 B |
| 2008/0081439 A1* | 4/2008 | Coffer | ............... | H01L 21/02603 438/584 |
| 2009/0233124 A1* | 9/2009 | Berg | ....................... | C01B 32/15 427/126.3 |
| 2010/0006820 A1* | 1/2010 | Park | ....................... | B82Y 10/00 257/14 |
| 2010/0213434 A1* | 8/2010 | Lee | ..................... | H01L 21/0262 257/E29.082 |
| 2010/0258525 A1* | 10/2010 | Gorintin | ................ | B82Y 35/00 427/256 |
| 2010/0317176 A1* | 12/2010 | Ryan | ................... | H01L 21/0262 257/E21.101 |
| 2011/0159286 A1* | 6/2011 | Park | ....................... | B82Y 40/00 977/890 |
| 2011/0168256 A1* | 7/2011 | Wang | ................... | H01L 31/109 136/258 |

(Continued)

*Primary Examiner* — Jaehwan Oh
(74) *Attorney, Agent, or Firm* — John P. DiScala

(57) ABSTRACT

Semiconductor nanofibers are produced at room temperature in a pressure vessel. A semiconductor wafer and metal catalyst are introduced into the pressure vessel. The pressure vessel is filled with a background gas. A nanofiber growth element is introduced into the pressure vessel. For example, the semiconductor may be ablated by a laser. The semiconductor is retained in the pressure vessel for a prolonged period of time until nanofiber growth appears.

20 Claims, 6 Drawing Sheets

(56) References Cited

U.S. PATENT DOCUMENTS

| | | | |
|---|---|---|---|
| 2013/0026443 A1* | 1/2013 | Park | H01L 29/0665 977/762 |
| 2013/0068286 A1* | 3/2013 | Wang | H01L 31/035227 977/948 |
| 2015/0037926 A1* | 2/2015 | Onicha | H01L 31/18 422/198 |
| 2015/0183188 A1* | 7/2015 | Richards | B82Y 10/00 428/209 |
| 2016/0178628 A1* | 6/2016 | Abdolahad | G01N 27/021 435/29 |

* cited by examiner

Prior Art FIG. 1

PROCESS FOR FABRICATING SEMICONDUCTOR NANOFIBERS

CROSS-REFERENCE TO RELATED APPLICATIONS

This application claims the benefit under 35 USC 119(e) of U.S. provisional patent application 62/841,283 filed May 1, 2019.

STATEMENT OF GOVERNMENT INTEREST

The inventions described herein may be manufactured and used by or for the United States Government for government purposes without payment of any royalties.

FIELD OF THE INVENTION

The present invention is directed generally to a method for preparing semiconductor nanofibers and more specifically to preparing nanofibers at room temperature.

BACKGROUND OF THE INVENTION

Semiconductor nanowires have been reported in the scientific literature since the 1990s, and have potential applicability for nanoscale electronic devices. Such structures are generally characterized by being composed of a semiconducting atomic species, possibly with some concentration of an impurity or alloy species, of having a cylindrical shape with a diameter on the order of several to several hundred nanometers (nm) and lengths on the order of several nm to several hundred micrometers (microns).

Such structures are generally produced using the 'vapor-liquid-solid' process illustrated in FIG. 1. In this process, a population of metal nanoparticles are deposited onto a wafer of the semiconductor in question. These particles act as a catalyst for nanofiber growth. The wafer is introduced to a vacuum chamber, which is evacuated to a low base pressure. The temperature is raised to a temperature at which the nanoparticles become liquid, and a background gas containing the semiconductor is introduced. The semiconductor atoms from the gas phase are captured by the metal nanoparticle, forming an alloy that is supersaturated in the semiconductor. As a result, the semiconductor atoms precipitate out of the particle, forming a 'stalk' that grows vertically beneath the metal nanoparticle, pushing the nanoparticle further off the surface as growth continues.

The prior art method has several important limitations. First, it has several process steps, notably beginning with the formation of nanoparticle catalysts on the growth substrate. A single-step process would be simpler. Second, it requires elevated temperatures so that the nanoparticle catalysts are molten or nearly molten. For gold and aluminum catalysts, this requires process temperatures that can be as high as 600° C. Third, the growth step requires the introduction of silane gas, which is highly toxic, resulting in extensive gas-handling and safety protocols for which the growth environment must be properly facilitized. Thus a need exists to address the limitations identified in the prior art process for nanoparticle formation.

SUMMARY OF THE INVENTION

A first aspect of the invention is a method for producing semiconductor nanofibers at room temperature in a pressure vessel. The method comprises the steps of: introducing a semiconductor wafer into the pressure vessel; introducing a background gas into the pressure vessel; introducing a nanofiber growth element into the pressure vessel in the presence of a metal catalyst; and retaining the nanofiber growth element within the pressure vessel for a period of time sufficient to produce a semiconductor nanofiber.

A second aspect of the invention is a method for producing semiconductor nanofibers at room temperature in a pressure vessel. The method comprising the steps of: introducing a silicon wafer into the pressure vessel; introducing a metal catalyst into the pressure vessel; evacuating the pressure vessel; introducing a background gas comprising fluorine into the pressure vessel; ablating the silicon wafer by directing a pulsed laser at directing a second harmonic Nd:YAG pulsed laser through a window in the pressure vessel onto the semiconductor wafer; and retaining the nanofiber growth element within the pressure vessel for a period of time sufficient to produce a semiconductor nanofiber.

BRIEF DESCRIPTION OF THE DRAWINGS

Further features and advantages of the present invention may be understood from the drawings.

Prior Art

DETAILED DESCRIPTION

The present invention is directed to a process by which semiconductor nanofibers are produced at room temperature in a pressure vessel. Advantageously, the process does not require as many steps as existing methods. Further, the process can be carried out at room temperature. Finally, the process does not require silane gas and therefore avoids the associated risks with handling and use.

Broadly, the process includes 1) introducing a semiconductor wafer into a pressure vessel, 2) introducing a background gas into the pressure vessel, 3) introducing a nanofiber growth element into the pressure vessel in the presence of a metal catalyst, and 4) holding the sample within the chamber for a prolonged time period until nanofiber growth appears.

The nanofibers are generally characterized by being composed of a semiconducting atomic species, possibly with some concentration of an impurity or alloy species, of having a cylindrical shape with a diameter on the order of several to several hundred nanometers (nm) and lengths on the order of several nm to several hundred micrometers (microns). The nanofibers may be employed in microelectronic applications. For example, the nanofibers may be utilized in lithium ion battery anodes, chemical/biology sensors or optical metamaterials for coatings and optoelectronic devices.

Figure 1:
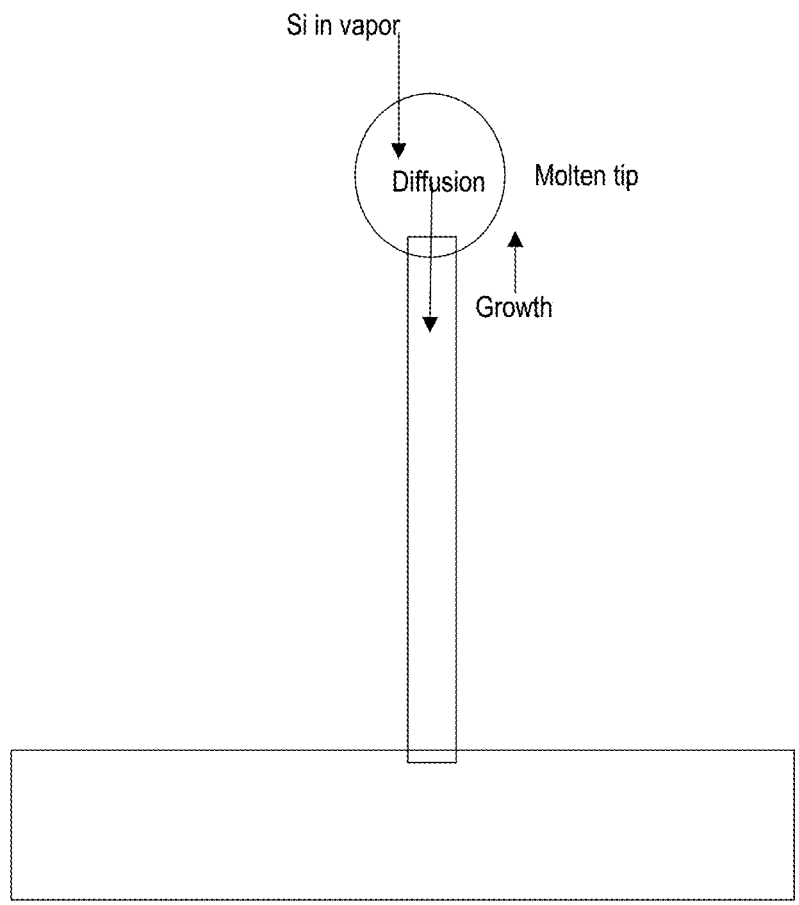
FIG. 1 is an illustration of a prior art system for producing nanofibers using a 'vapor-liquid-solid' process.
Figure 2:
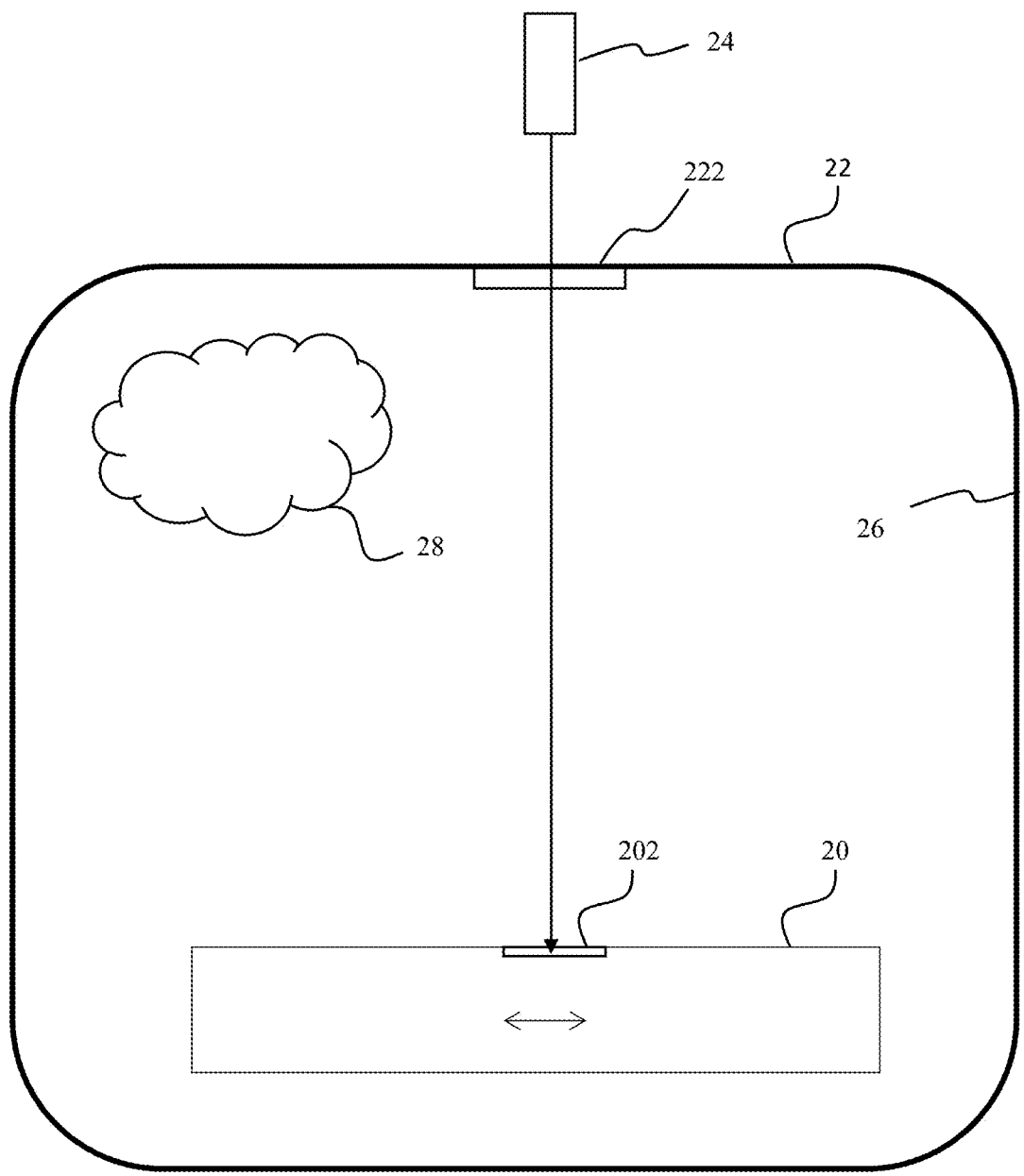
FIG. 2 is an illustration of a system for producing nanofibers at an ablation stage, according to an illustrative embodiment.
Figure 3:
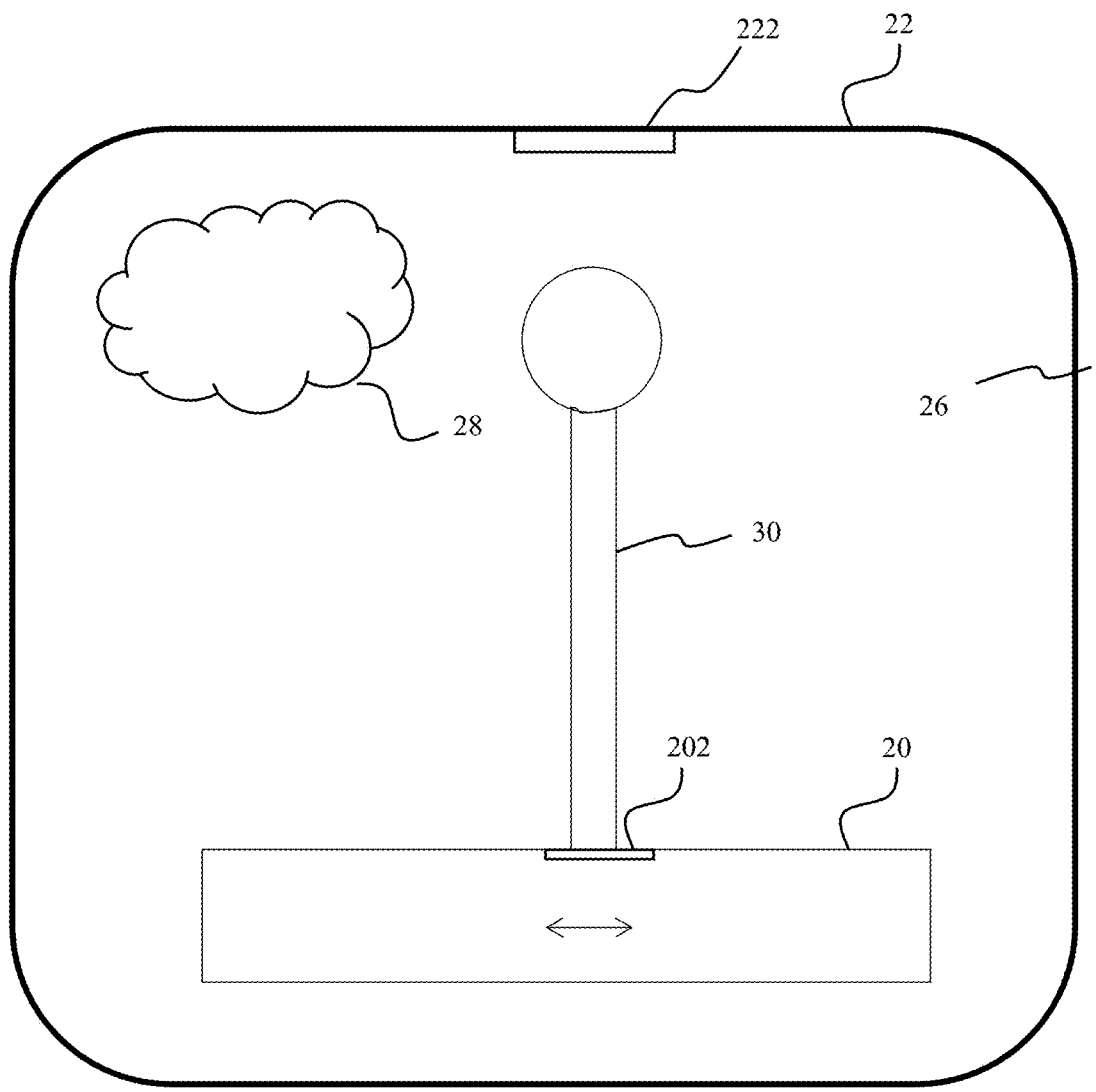
FIG. 3 is an illustration of a system for producing nanofibers in a growth stage, according to an illustrative embodiment.
Figure 4:
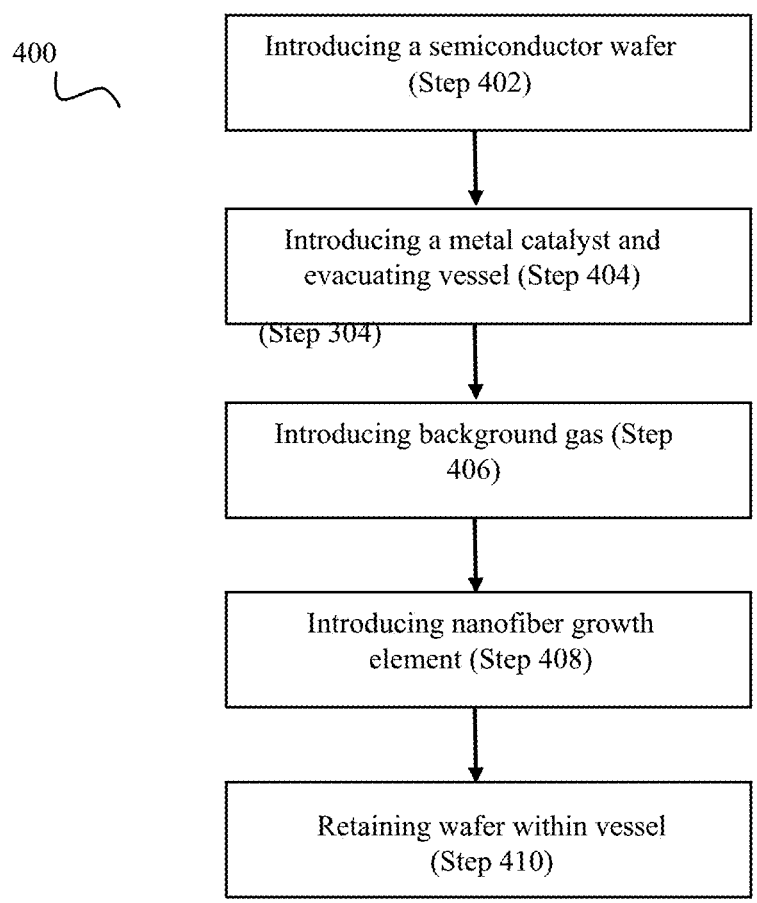
FIG. 4 is a flowchart illustrating the process for producing nanofibers, according to an illustrative embodiment.

FIG. 2 is an illustration of a system for producing nanofibers at an ablation stage, according to an illustrative embodiment. FIG. 3 is an illustration of a system for producing nanofibers in a growth stage, according to an illustrative embodiment. FIG. 4 is a flowchart illustrating the process for producing nanofibers, according to an illustrative embodiment. In more detail, the process consists of several discrete steps.

At step 402, a semiconductor wafer 20, is placed into a pressure vessel 22. The pressure vessel 22, such as a vacuum chamber, may be a metal pressure vessel 22. As will be described below, the presence of metal in the structure of the pressure vessel 22 may be advantageous to the process. The pressure vessel 22 further comprises a window 222 for a laser 24. For example, the pressure vessel 22 may further comprise a quartz viewport.

The semiconductor wafer 20 may be an elemental semiconductor wafer 20. Elemental semiconductors known to show the claimed nanofiber growth behavior include silicon. Alternatively, the semiconductor wafer 20 may be a germanium semiconductor, whereas compound semiconductors such as GaAs or InP are less likely to exhibit the claimed nanofiber growth.

In step 404, a catalyst metal 26 is introduced to the pressure vessel 22 and the vessel 22 is evacuated. Catalyst metals 26 known to show the claimed nanofiber growth behavior is preferably aluminum, however gold or iron may also be utilized. Such catalyst metal 26 may also be part of the structural material of the chamber itself.

In an alternative embodiment, the catalyst metal 26 may be introduced in a templated arrangement so as to control the diameter and orientation of the nanofibers and their spatial arrangement.

In step 406, a background gas 28 containing fluorine, is introduced into the vessel 22 at a pressure of 600 Torr, slightly below, atmospheric pressure. Gases 28 known to show the claimed behavior include sulfur hexafluoride (SF6), but other gases containing fluorine such as hydrogen fluoride (HF) or fluorine gas ($F_2$) may be utilized, as well. It should be noted that SF6 is chemically inert, and a more reactive fluoride gas may not remain in the chamber without reacting for long enough to produce the nanofiber growth.

In step 408, the nanofiber growth element is introduced into the pressure vessel 22 by ablating the semiconductor wafer 20 having such growth element. In an exemplary embodiment, the growth element is silicon and a pulsed laser 24 is shone through a window 222 in the pressure vessel 22 onto the wafer 20 at a sufficient high intensity to induce appreciable ablation of the silicon atoms of the wafer 20. The intensity is laser-dependent, but for the second harmonic of a Nd:YAG laser 24, operating at 532 nm, an intensity of 2.5 $J/cm^2$ is sufficient to induce appreciable ablation sufficient for the effect to be observed. The laser 24 is moved relative to the surface so an area 202 larger than the laser spot is irradiated. A minimum quantity of ablation must be performed to produce the claimed nanofiber growth effect. For a pressure vessel 22 having a volume of 12,000 $cm^3$, at least 780,000 individual laser shots are required for the claimed behavior to be observed, but a vessel 22 of larger or smaller volume may require more or less total ablation, respectively.

In step 410, the wafer 20 is allowed to sit with no removal of gas 28 occurring to the pressure vessel 22, for an extended period of time. During this time, no additional gas is deliberately introduced, but oxygen may slowly leak into the vessel 22 over an extended period of time. In the embodiments described above, at least 8 weeks are required to produce the semiconductor nanofibers 30, but longer immersion will increase the concentration and length of the semiconductor nanofibers 30.

Example 1

P-type silicon (100) wafers were loaded into a vacuum chambers, made of Al. The chamber was evacuated to a pressure of $10^{-5}$ Torr and then backfilled with approximately 1 atmosphere of SF6 gas. The chamber contained a quartz viewport, and the second harmonic of an Nd:YAG laser (532 nm) was steered vertically through this viewport to irradiate the sample at normal incidence at a fluence of approximately 2.5 J/cm2. The chamber was translated back and forth in x and y using a motorized stage such that a square region was irradiated. After irradiation, the chamber was allowed to sit undisturbed for an extended period of time, which was varied, from days to months. After this, the chamber was evacuated, flushed with N2, and then the sample wafer was removed. The sample surface was imaged using scanning electron microscopy (SEM). "Soot" generated by the ablation process was also collected onto TEM grids and imaged with a scanning transmission electron microscope (STEM) detector in a conventional SEM. All experiments are performed at room temperature.

A sample held in the Al chamber at room temperature after irradiation for three months was observed to have a dense network of fibrous structures of varying diameter, with the smallest being several tens of nm. The fibers are long, and appear to originate on large clusters, some of which may have been ejected during the ablation process. Many of the fibers show small, round particles at their tips, comparable in size to the fiber itself.

Figure 5:
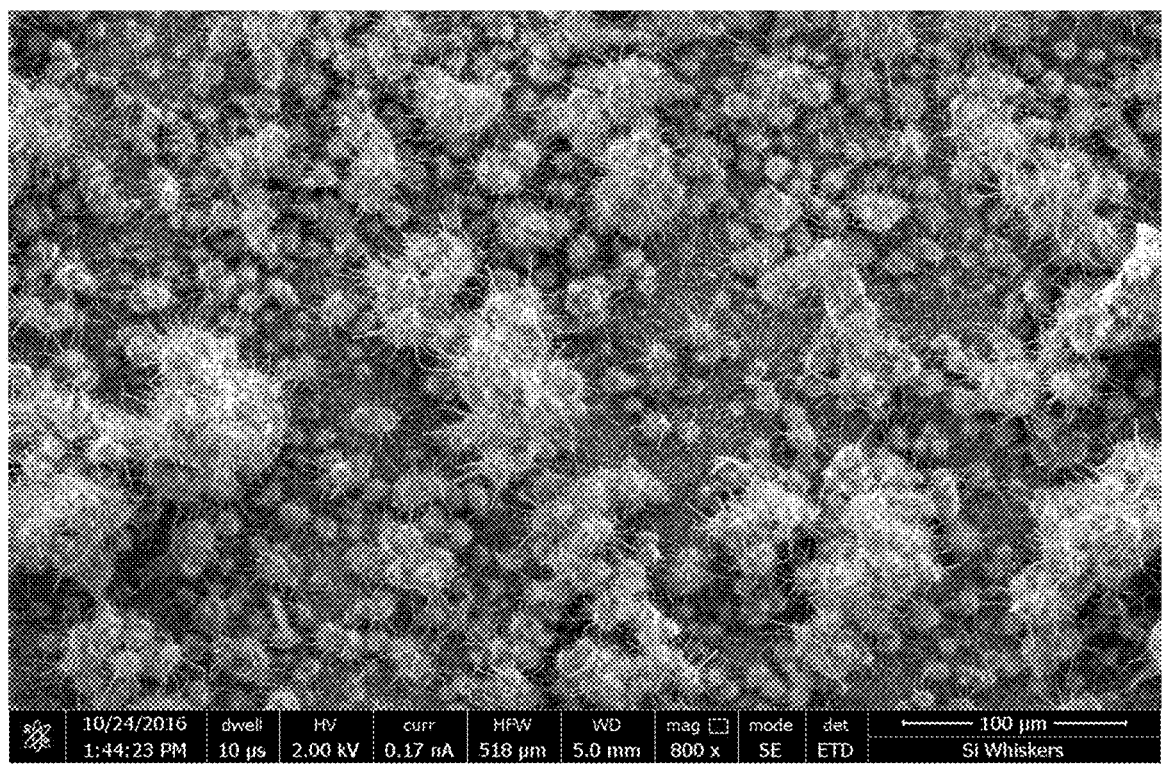
FIG. 5 is a photograph of the nanofibers prepared using the methods disclosed herein at 800× magnification having a scale of 100 microns, according to an illustrative embodiment.
Figure 6:
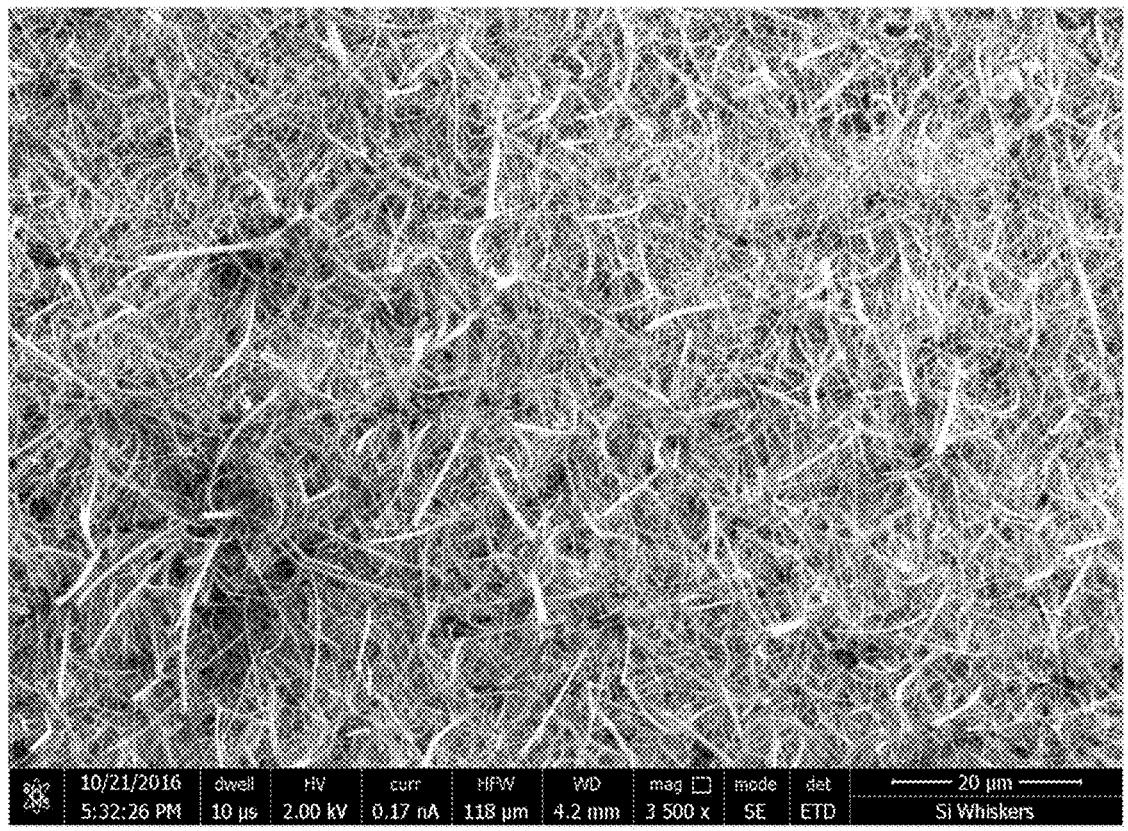
FIG. 6 is a photograph of the nanofibers prepared using the methods disclosed herein at 3500× magnification having a scale of 20 microns, according to an illustrative embodiment.

A representative laser-irradiated area is shown in FIGS. 5 and 6 at various magnification. FIG. 5 is a photograph of the nanofibers prepared using the methods disclosed herein at 800× magnification having a scale of 100 microns, according to an illustrative embodiment. FIG. 6 is a photograph of the nanofibers prepared using the methods disclosed herein at 3500× magnification having a scale of 20 microns, according to an illustrative embodiment. The presence of laser-altered topography is evident, and the network of fibers that decorate this topography is increasingly visible as the magnification increases. However, non-irradiated areas of the top of the sample surface also show these fibers, albeit not always with the same density.

The foregoing description of the preferred embodiment of the present invention has been presented for the purpose of illustration and description. It is not intended to be exhaustive or to limit the invention to the precise form disclosed. Many modifications and variations are possible in light of the above teachings. It is intended that the scope of the present invention not be limited by this detailed description but by the claims and any equivalents.

What is claimed is:

1. A method for producing semiconductor nanofibers at room temperature in a pressure vessel, the method comprising the steps of:
   introducing a semiconductor wafer into the pressure vessel;
   introducing a background gas into the pressure vessel;
   introducing a nanofiber growth element into the pressure vessel in the presence of a metal catalyst; and retaining the nanofiber growth element within the pressure vessel for a period of time sufficient to produce a semiconductor nanofiber.

2. The method of claim 1 wherein the semiconductor wafer is a silicon wafer.

3. The method of claim 1 wherein the semiconductor wafer is a germanium wafer.

4. The method of claim 1 further comprising the steps of introducing a catalyst metal into the pressure vessel and evacuating the vessel.

5. The method of claim 4 wherein the metal catalyst is integral with the pressure vessel.

6. The method of claim 1 wherein the metal catalyst is selected from the group consisting of: aluminum, gold, and iron.

7. The method of claim 1 wherein the background gas comprises fluorine.

8. The method of claim 7 wherein the background gas is selected from the group consisting of: sulfur hexafluoride, hydrogen fluoride or fluorine gas.

9. The method of claim 1 wherein the background gas is introduced at a pressure of 600 Torr.

10. The method of claim 1 wherein the step of introducing a nanofiber growth element into the pressure vessel in the presence of a metal catalyst further comprises ablating the semiconductor wafer.

11. The method of claim 10 wherein ablating the semiconductor wafer comprises directing a pulsed laser through a window in the pressure vessel onto the semiconductor wafer.

12. The method of claim 11 wherein directing the pulsed laser through a window further comprises moving the pulsed laser relative to a top surface of the semiconductor wafer.

13. The method of claim 11 wherein the laser is a second harmonic Nd:YAG laser.

14. The method of claim 13 wherein the intensity of the second harmonic Nd:YAG laser is 2.5 J/cm2.

15. The method of claim 1 wherein the period of time sufficient to produce a semiconductor nanofiber is eight weeks.

16. A method for producing semiconductor nanofibers at room temperature in a pressure vessel, the method comprising the steps of:
  introducing a silicon wafer into the pressure vessel;
  introducing a metal catalyst into the pressure vessel;
  evacuating the pressure vessel;
  introducing a background gas comprising fluorine into the pressure vessel;
  ablating the silicon wafer by directing a pulsed laser at directing a second harmonic Nd:YAG pulsed laser through a window in the pressure vessel onto the semiconductor wafer; and
  retaining the nanofiber growth element within the pressure vessel for a period of time sufficient to produce a semiconductor nanofiber.

17. The method of claim 16 wherein the metal catalyst is integral with the pressure vessel.

18. The method of claim 16 wherein the metal catalyst is selected from the group consisting of: aluminum, gold, and iron.

19. The method of claim 16 wherein the background gas is selected from the group consisting of: sulfur hexafluoride, hydrogen fluoride or fluorine.

20. The method of claim 16 wherein the period of time sufficient to produce a semiconductor nanofiber is eight weeks.

* * * * *